US011134030B2

United States Patent
Kumar et al.

(10) Patent No.: US 11,134,030 B2
(45) Date of Patent: Sep. 28, 2021

(54) DEVICE, SYSTEM AND METHOD FOR COUPLING A NETWORK-ON-CHIP WITH PHY CIRCUITRY

(71) Applicant: Intel Corporation, Santa Clara, CA (US)

(72) Inventors: Akhilesh Kumar, Saratoga, CA (US); Surhud Khare, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 108 days.

(21) Appl. No.: 16/542,922

(22) Filed: Aug. 16, 2019

(65) Prior Publication Data

US 2019/0372911 A1 Dec. 5, 2019

(51) Int. Cl.
| | |
|---|---|
| *H04J 3/06* | (2006.01) |
| *H04L 12/933* | (2013.01) |
| *H04L 12/715* | (2013.01) |
| *H04L 12/773* | (2013.01) |
| *G06F 15/78* | (2006.01) |

(52) U.S. Cl.
CPC ........ *H04L 49/109* (2013.01); *G06F 15/7825* (2013.01); *H04L 45/46* (2013.01); *H04L 45/60* (2013.01)

(58) Field of Classification Search
CPC ....... H04L 49/109; H04L 45/46; H04L 45/60; H04L 49/00; H04L 49/101; H04B 10/27; H04B 10/801; H01L 2224/16225; H01L 2924/15311; G06F 15/7825; G06F 15/08; G06F 11/2236; G06F 11/27
See application file for complete search history.

(56) References Cited

U.S. PATENT DOCUMENTS

| | | | | |
|---|---|---|---|---|
| 4,695,872 A * | 9/1987 | Chatterjee | ........... | H01L 23/5385 257/700 |
| 5,347,428 A * | 9/1994 | Carson | ................ | H01L 25/0657 174/260 |
| 8,042,087 B2 * | 10/2011 | Murali | .................... | G06F 30/30 716/138 |
| 8,270,316 B1 * | 9/2012 | Chang | ................. | G06F 15/7825 370/254 |
| 8,340,517 B2 * | 12/2012 | Shacham | ............... | H04B 10/25 398/46 |
| 9,111,151 B2 * | 8/2015 | Chen | .................... | G06F 15/7825 |
| 9,443,561 B1 * | 9/2016 | Roberts | ............... | G06F 13/4027 |

(Continued)

*Primary Examiner* — Stephen M D Agosta
(74) *Attorney, Agent, or Firm* — Green, Howard & Mughal LLP.

(57) ABSTRACT

Techniques and mechanisms for interconnecting network circuitry of an integrated circuit (IC) die and physical layer (PHY) circuits of the same IC die. In an embodiment, nodes of the network circuitry include first routers and processor cores, where the first routers are coupled to one another in an array configuration which includes rows and columns. First interconnects each extend to couple both to a corresponding one of the PHY circuits and to a corresponding one of the first routers. For each of one or more of the first interconnects, a respective one or more rows (or one or more columns) of the array configuration extend between the corresponding PHY and the corresponding router. In another embodiment, the network circuitry comprises network clusters which each include a different respective row of the array configuration.

17 Claims, 9 Drawing Sheets

(56) References Cited

U.S. PATENT DOCUMENTS

| | | | |
|---|---|---|---|
| 10,243,881 B2* | 3/2019 | Bandic | H04L 49/00 |
| 10,250,958 B2* | 4/2019 | Chen | H04Q 11/0066 |
| 10,657,216 B2* | 5/2020 | Chen | H04L 49/9031 |
| 2006/0248287 A1* | 11/2006 | Buyuktosunoglu | G06F 12/0897 |
| | | | 711/146 |
| 2007/0113123 A1* | 5/2007 | Crouch | H04L 45/60 |
| | | | 714/724 |
| 2008/0164907 A1* | 7/2008 | Mercaldi-Kim | H03K 19/177 |
| | | | 326/41 |
| 2009/0024799 A1* | 1/2009 | Jahagirdar | G06F 1/3287 |
| | | | 711/130 |
| 2011/0010525 A1* | 1/2011 | Binkert | G06F 15/17343 |
| | | | 712/29 |
| 2011/0072239 A1* | 3/2011 | Burger | G06F 9/3885 |
| | | | 712/29 |
| 2011/0149985 A1* | 6/2011 | Ashida | H04L 45/02 |
| | | | 370/401 |
| 2014/0177473 A1* | 6/2014 | Kumar | H04L 45/58 |
| | | | 370/255 |
| 2016/0070603 A1* | 3/2016 | Lu | G06F 9/5088 |
| | | | 718/104 |
| 2020/0153757 A1* | 5/2020 | Bharadwaj | H04L 49/109 |

* cited by examiner

DEVICE, SYSTEM AND METHOD FOR COUPLING A NETWORK-ON-CHIP WITH PHY CIRCUITRY

BACKGROUND

1. Technical Field

This disclosure generally relates to integrated circuitry and more particularly, but not exclusively, to interconnect structures to facilitate communication with a network-on-chip.

2. Background Art

Networks-on-Chip (NoCs), for on-die communication between cores, are important in enabling scalable performance as the number of cores and intellectual property (IP) blocks increases in multi-core processors. In such instances, communication between components becomes an important power and performance limiter. NoCs enable efficient sharing of on-chip wiring resources for communication with routers to control and arbitrate the flow of data between communicating components.

NoCs typically utilize packet-switched channels or circuit-switched channels to send data between the cores of the NoC. Traditionally, server NoCs are architected with 2D mesh interconnect topologies, wherein any communication to or from such an NoC is performed with one or more routers that are each at a respective edge of such a 2D mesh.

Future server network-on-chip (NoC) architectures are projected to integrate processor core counts in the range of 100 to 200. These architectures are expected to have communication bandwidth requirements approaching several terabits per second (Tb/s). Accordingly, there is expected to be an increasing premium placed on improvements to circuit structures which facilitate communication with a NoC.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1A:
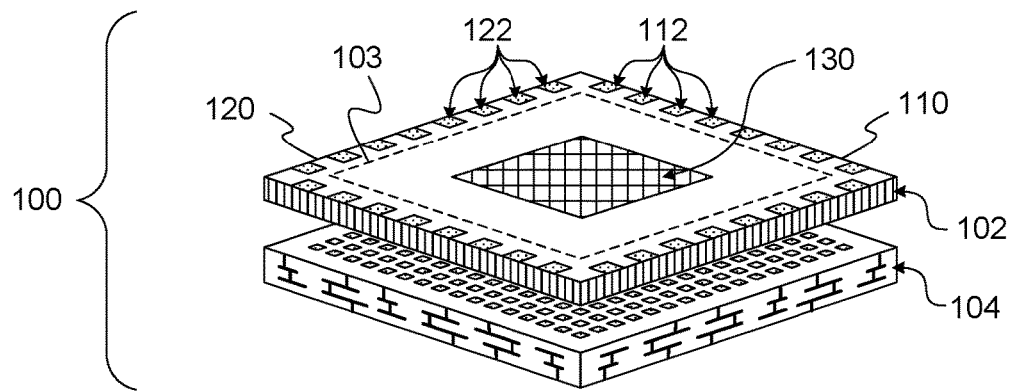
FIG. 1A illustrates an exploded view of a system comprising a network-on-chip according to an embodiment.

Embodiments discussed herein variously provide techniques and mechanisms for facilitating efficient communication between network circuitry and physical layer circuitry each of the same integrated circuit (IC) die. The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computers, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including an IC die which comprises network-on-chip circuitry.

In the following description, numerous details are discussed to provide a more thorough explanation of the embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

It is to be understood that the terms so used are interchangeable under appropriate circumstances such that the embodiments of the invention described herein are, for example, capable of operation in other orientations than those illustrated or otherwise described herein.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. It is pointed out that those elements of a figure having the same reference numbers (or names) as the elements of any other figure can operate or function in any manner similar to that described, but are not limited to such.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

It is pointed out that those elements of the figures having the same reference numbers (or names) as the elements of any other figure can operate or function in any manner similar to that described, but are not limited to such.

In various embodiments, an IC die comprises physical layer (PHY) circuits and other circuits which are to operate as nodes of a network-on-chip. Said nodes comprise at least some first routers and multiple processor cores, wherein the first routers are coupled to one another (or otherwise accommodate such coupling) in an array configuration which includes multiple rows and multiple columns. In some embodiments, first interconnects each extend to couple both to a corresponding one of the PHY circuits and to a corresponding one of the first routers. In one such embodiment, for each of one or more of the first interconnects, a respective one or more rows (or one or more columns) of the array configuration extend between the corresponding PHY and the corresponding router. For example, the one or more of the first interconnects each extend to a respective router other than any router in an edge row (or edge column) of the array configuration.

Accordingly, some embodiments facilitate a distribution of "point-of-access" routers in an array configuration of a network-on-chip—e.g., including one or more such point-of-access routers other than any router at an edge of the array configuration. In this context, "point-of-access router" refers to a router which is coupled, via a respective point-to-point interconnect (or "link"), to a corresponding PHY circuit—e.g., where no other network node is coupled between said point-of-access router and the corresponding PHY circuit. In some embodiments, such a distribution of point-of-access routers mitigates bandwidth bottlenecks that would otherwise be experienced at one or more edges rows and/or one or more edge columns of the array configuration. Alternatively or in addition, such a distribution avoids space efficiencies that might otherwise result from PHY circuits being variously located, physically, between respective nodes of a network-on-chip. In some embodiments, network circuitry of an IC chip facilitates any of various interconnect schemes—e.g., including interconnection via a silicon substrate or other such substrate structure—to enable 2D, 2.5D and/or 3D solutions for enabling communication with a network-on-chip.

In various embodiments, an IC die comprises circuits which are configured to function as respective nodes in a group of network resources which is referred to herein as "network cluster" (or, for brevity, simply "cluster"). In one such embodiment, the IC die comprises respective nodes of multiple clusters which each have the same network topology—e.g., wherein multiple chiplets of the IC die each include nodes of a respective one or more clusters.

Some embodiments facilitate hierarchical routing wherein a given network cluster, or group of network clusters, belongs to (or otherwise corresponds with) a respective level of a routing hierarchy. For example, one or more other such levels of the hierarchy each include a different respective one or more network clusters. To facilitate hierarchical routing, some embodiments access, maintain or otherwise provide information (e.g., including routing tables) which specifies or otherwise indicates a correspondence of various network nodes each with a respective hierarchical level. Such routing is performed with one or more operations that, for example, are adapted from conventional hierarchical routing techniques (which are not detailed herein in order to avoid obscuring certain features of various embodiments).

Some embodiments additionally or alternatively provide a hierarchical interconnect architecture which, for example, comprises interconnect structures of an IC die and, in some embodiments, interconnect structures of a substrate (such as that of an interposer) which is coupled to the IC die. For example, for a given network cluster, nodes of the cluster are variously coupled to one another via interconnect structures of the IC die. In one such embodiment, for a given two network clusters, respective nodes of said clusters are coupled to one another via interconnect structures of a substrate which is coupled to the IC die. With such an interconnect architecture, some embodiments variously facilitate high-bandwidth intra-cluster and/or inter-cluster (e.g., intra-chiplet and/or inter-chiplet) communication—e.g., in addition to efficient communication between network clusters and PHY circuits which are variously coupled thereto. Additionally or alternatively, some or all such embodiments facilitate scale-up and/or scale-out of network-on-chip architectures.

FIG. 1A shows features of a system 100 to provide connectivity with a network-on-chip according to an embodiment. System 100 is one example of an embodiment wherein a region of an IC die includes network circuitry, and wherein physical layer (PHY) circuits of the IC die are variously disposed each at a respective side of the region. The network circuitry comprises processor cores and at least some plurality of routers variously coupled thereto, wherein the plurality of routers are arranged in an array configuration comprising rows and columns. For each of one or more of the PHY circuits, a respective one or more of the rows (or a respective one or more of the columns) extends between the PHY circuit and a corresponding one of the first routers, wherein a respective interconnect extends to (e.g., is coupled at) both the PHY circuit and said corresponding router.

As shown in FIG. 1A, system 100 comprises an IC die 102 and a substrate (such as that of the illustrative one or more interposer 104 shown) which is coupled thereto—e.g., via wire bonding, a flip chip connection, or the like. A region 103 of die 102 has formed therein or thereon network circuitry 130 which comprises processor cores and network devices variously coupled to said processor cores. The network devices comprise at least some plurality of routers that are coupled to one another in an array configuration.

In the example embodiment shown, die 102 further comprises PHY circuits ("PHYs") which are variously disposed each at a respective side of region 103. By way of illustration and not limitation, die 102 comprises PHYs 112 which are variously arranged along a first side 110 of region 103—e.g., wherein PHYs 112 are arranged along a first edge of die 102. Alternatively or in addition, die 102 comprises PHYs 122 which are variously arranged along a second side 120 of region 103—e.g., wherein PHYs 122 are arranged along a second edge of die 102. Die 102 comprises, for example, one or more memory controllers which each include (or alternatively, are coupled to communicate via) a respective one of PHYs 112, 122. Some embodiments are not limited to the particular number and/or arrangement of such PHYs each at respective edge of region 103. For example, in other embodiments, some or all of PHYs 112, 122 are offset each from a respective edge of die 102, but are nevertheless variously located at or around a periphery of region 103.

PHYs 112, 122 variously facilitate communication between network circuitry 130 and one or more circuit resources which are external to network circuitry 130—e.g., wherein some or all such circuit resources are distinct from, but coupled to, die 102. In one such embodiment, the circuit resources include memory sub-system resources comprising, for example, one or more memory controllers and/or one or more memory (e.g., DRAM) arrays. Alternatively or in addition, such circuit resources comprise one or more busses with which signals (e.g., comprising data signals, control signals, clock signals or the like) are variously transmitted from or received by die 102.

Interposer 104 illustrates any of various suitable devices (e.g., comprising a silicon interposer or a package substrate) which comprise a substrate and conductive traces, vias and/or other interconnect structures that variously extend in said substrate, where such interconnect structures facilitate communication with circuitry of die 102.

In one such embodiment, interconnects of interposer 104 couple circuitry of die 102 with other circuitry of die 102—e.g., wherein interposer 104 couples circuitry of network circuitry 130 with other circuitry of network circuitry 130 and/or where interposer 104 couples network circuitry 130 with one or more of PHYs 112, 122. Additionally or alternatively, interposer 104 couples one or more of PHYs 112, 122 each with a respective circuit resource which is distinct from die 102—e.g., including a circuit resource of interposer 104 or that of another IC die (not shown) which is to couple to, or is a component of, system 100. In one such embodiment, interposer 104 further extends past the periphery of die 102 to facilitate coupling of interposer 104 with one or more other IC dies. In another embodiment, system 100 comprises a die stack which is disposed on interposer 104, where said die stack includes die 102 and one or more other IC dies (not shown).

Some embodiments variously facilitate efficient access to a NoC (such as that illustrated by network circuitry 130) by variously providing PHY circuits with respective points-of-access to the NoC. In such embodiments, the NoC comprises routers which are coupled to one another in an array configuration, where said points-of-access are distributed among different rows and/or among different columns of the array configuration.

Figure 1B:
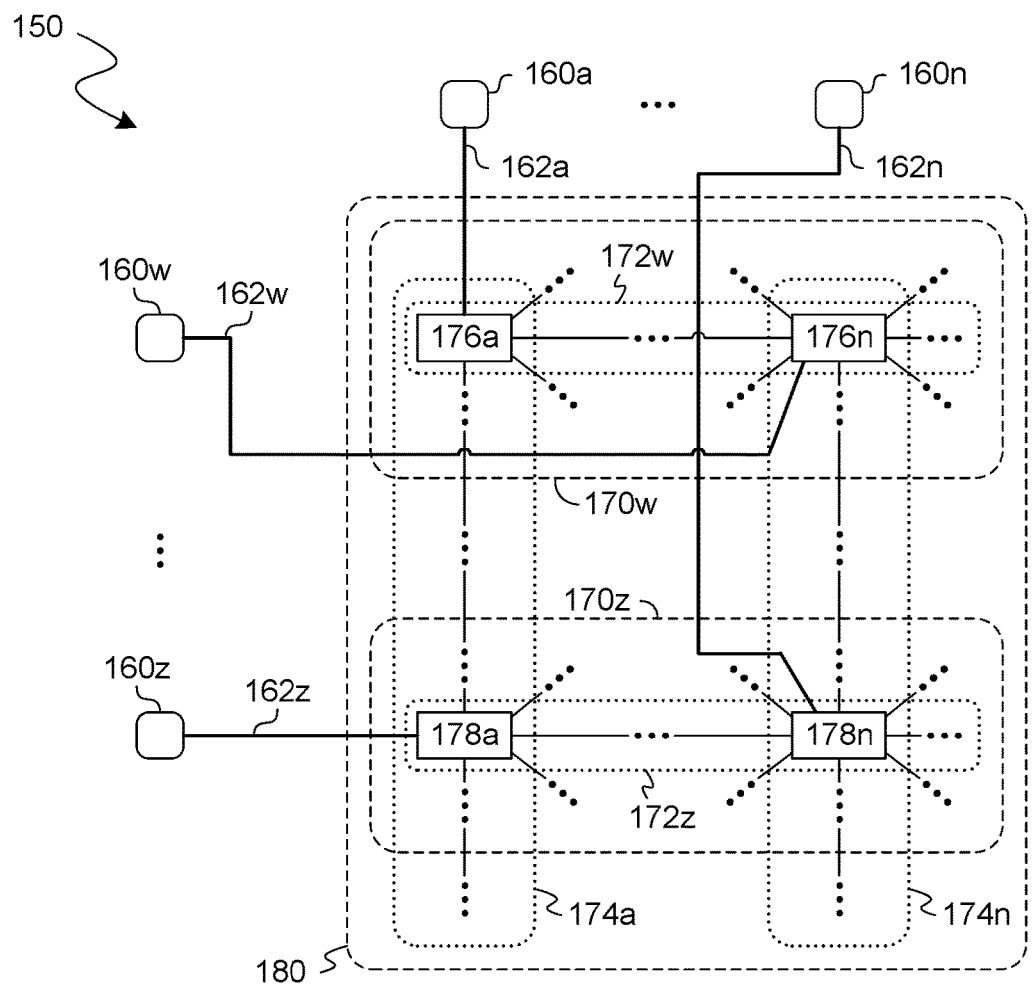
FIG. 1B illustrates a layout diagram showing an integrated circuit die comprising network circuitry according to an embodiment.

For example, as shown in FIG. 1B, a device 150 according to one embodiment provides efficient communication between NoC circuitry and one or more PHY circuits. Device 150 provides some or all of the functionality of system 100—e.g., wherein device 150 comprises die 102 and, in some embodiments, further comprises a substrate such as that illustrated by interposer 104. In the example embodiment shown, device 150 comprises network circuitry

180 and PHYs variously coupled thereto—e.g., wherein PHYs 160a, . . . , 160n of device 150 correspond functionally to PHYs 112, and/or where PHYs 160w, . . . , 160z of device 150 correspond functionally to PHYs 122. Network circuitry 180 of device 150 provides functionality of network circuitry 130, for example. In an embodiment, network circuitry 180 comprises processor cores (not shown) and at least some first routers which are variously coupled to said processor cores, wherein the first routers are arranged in an array configuration comprising rows and columns. Device 150 comprises, for example, one or more memory controllers which each include (or alternatively, are coupled to communicate via) a respective one of PHYs 160a, . . . , 160n and PHYs 160w, . . . , 160z—e.g., wherein cores of network circuitry 180 variously access off-chip memory resources with said one or more memory controllers.

By way of illustration and not limitation, an array configuration provided with network circuitry 180 comprises rows 172w, . . . , 172z and columns 174a, . . . , 174n which each include respective network devices that are coupled to one another in an in-series configuration. In one such embodiment, the first routers of the array configuration comprise routers 176a, . . . , 176n of row 172w, where said routers 176a, . . . , 176n are coupled in series with one another. The first routers further comprise routers 178a, . . . , 178n of row 172z which are also coupled in series with one another. In one such embodiment, a first row of the array configuration (e.g., row 172w) is a closest of the rows to the first PHYs 160a, . . . , 160n. The first routers further comprise the respective routers of one or more other rows (not shown), in various embodiments.

Columns of such an array configuration comprise respective routers which are each of a different respective one of the rows. For example, column 174a comprises routers (including routers 176a, 178a) which are coupled in series with each other and which are each of a different respective one of rows 172w, . . . , 172z. Similarly, column 174z comprises other routers (including routers 176a, 178a) which are also coupled in series with each other and which are each of a different respective one of rows 172w, . . . , 172z. In one such embodiment, a first column of the array configuration (e.g., column 174a) is a closest of the columns to the second PHYs 160w, . . . , 160z. In various embodiments, the array configuration further comprises one or more other columns (not shown) which each include respective routers which are each of a different respective one of rows 172, . . . , 172z.

To facilitate communication with NoC circuitry of device 150, some or all of PHYs 160a, . . . , 160n and PHYs 160w, . . . , 160z are variously coupled to network circuitry 180 via some plurality of interconnects (or "first links") which each extend to be coupled both at a corresponding one of said PHYs and at a corresponding one of the first routers. For any given one of said first links, the corresponding router is coupled via said link to function as a point of access, by the corresponding PHY, to the array configuration—e.g., where said coupling is independent of any other router of the array configuration.

In some embodiments, for each link of one or more of the first links, a respective one or more of rows 172w, . . . , 172z (or a respective one or more of columns 174a, . . . , 174n) extends between the corresponding PHY and corresponding one of the first routers. For example, some or all of said first links each extend along a respective one of columns 174a, . . . , 174n or along a respective one of rows 172w, . . . , 172z. In one such embodiment, one or more of the first links each extend across a respective one or more of rows 172w, . . . , 172z, or across a respective one or more of columns 174a, . . . , 174n.

In the example embodiment shown, the first links comprises links 162a, . . . , 162n which each extend both to a respective one of PHYs 160a, . . . , 160n and to a respective one of the first routers. Alternatively or in addition, the first links comprises links 162w, . . . , 162z which each extend both to a respective one of PHYs 160w, . . . , 160w and to a respective one of the first routers. In some embodiments, at least one of links 162a, . . . , 162n extends to a router other than any router of a row (in this example, row 172w) which is a closest row to the corresponding PHY. For example, in various embodiments, one or more of links 162a, . . . , 162n each extend across a respective one or more of rows 172w, . . . , 172z. In one such embodiment, two or more of links 162a, . . . , 162n (and in some embodiments, all of links 162a, . . . , 162n) each extend to couple to a different respective one of rows 172w, . . . , 172z.

Additionally or alternatively, at least one of links 162w, . . . , 162z extends to a router other than any router of a column (in this example, column 174a) which is a closest column to the corresponding PHY. For example, in various embodiments, one or more of links 162w, . . . , 162z each extend across a respective one or more of columns 174a, . . . , 174n. In one such embodiment two or more of links 162w, . . . , 162z (and in some embodiments, all of links 162w, . . . , 162z) each extend to couple to a different respective one of columns 174a, . . . , 174n.

By way of illustration and not limitation, link 162a extends to couple PHY 160a to the router 176a of the closest row 172w to PHYs 160a, . . . , 160n, where link 162n extends along column 174n (and across row 172w) to couple PHY 160n to router 178n of a more distant row 172z. Furthermore, link 162z extends to couple PHY 160z to router 178a of the closest column 174a to PHYs 160w, . . . , 160z. However, link 162w extends along row 172w (and across column 174a) to couple PHY 160w to router 176n of a relatively more distant column 174n.

Accordingly, routers 176a, 178n—of different respective rows 172w, 172z—are coupled to provide PHYs 160a, 160n (respectively) each with a corresponding point of access to network circuitry 180. Similarly, routers 176n, 178a—of different respective columns 174n, 174a—are coupled to provide PHYs 160w, 160z (respectively) each with a corresponding point of access to network circuitry 180. Accordingly, PHYs are provided with various points of access to network circuitry 180 which are distributed among multiple rows and/or multiple columns of the array configuration—e.g., wherein one or more such points of access are each in a respective row other than a closest row to a corresponding PHY and/or in a respective column other than a closest columns to the corresponding PHY.

Although some embodiments are not limited in this regard, network circuitry 180 comprises network clusters (e.g., including the illustrative clusters 170w, . . . , 170z shown) which, in turn, each comprise respective processor cores and any of various suitable combinations of switches, routers, bridges and/or other such circuit devices to facilitate networked communication with said cores. In one such embodiment, for a given one of said clusters, the cluster comprises a respective row of the array configuration—e.g., wherein clusters are coupled to one another column-wise and wherein columns of the array configuration each include respective routers which are each of a different respective cluster.

By way of illustration and not limitation, cluster 170w comprises row 172w, wherein some or all of the routers 176a, ..., 176n of row 172w are variously linked each to a respective one or more other network nodes (not shown) of cluster 170w. Such one or more network nodes each comprises a respective one of a core, a switch, a router, or a bridge, for example. Alternatively or in addition, cluster 170z comprises row 172z, wherein some or all of the routers 178a, ..., 178n of row 172z are variously linked each to a respective one or more other network nodes (not shown) of cluster 170z.

In one such embodiment, clusters 170w, ..., 170z each comprise respective bridges (not shown) by which said clusters 170w, ..., 170z are coupled to one another column-wise. By way of illustration and not limitation, in some embodiments, row 174a further comprises respective bridges (not shown) of clusters 170w, 170z, where said bridges are coupled between routers 176a, 178a. Alternatively or in addition, row 174n further comprises respective other bridges (not shown) of clusters 170w, 170z, where said other bridges are coupled between routers 176n, 178n. In some embodiments, two or more of clusters 170w, ..., 170z each have the same respective internal network topology.

In some embodiments, the structures of device 150 are implemented entirely with a single integrated circuit die (e.g., wherein IC die 102 is or otherwise comprises device 150). In various other embodiments, only some of device 150 is implemented with an IC die, wherein at least some interconnect structures (for example) of device 150 are instead implemented with structures which are integrated in or on a substrate—e.g., that of an interposer or another IC die—which is coupled to said IC die.

For example, in some embodiments, an IC die comprises the network nodes of clusters 170w, ..., 170z, as well as PHYs 160a, ..., 160n and PHYs 160w, ..., 160z. The IC die further comprises, for example, some or all interconnects which are variously coupled between the network nodes of a given cluster. In one such embodiment, a substrate—coupled to such an IC die—has formed therein at least a portion of links 162a, ..., 162n and/or at least a portion of links 162w, ..., 162z. Alternatively or in addition, such a substrate has formed therein at least a portion of one or more interconnects which each couple a respective two clusters to each other. By way of illustration and not limitation, a substrate such as that provided by interposer 104 comprises (in some embodiments) at least a portion of an interconnect of column 174a, where such portion is to be coupled between routers 176a, 178a. Alternatively or in addition, such a substrate comprises at least a portion of an interconnect of column 174n, where such portion is to be coupled between routers 176n, 178n.

Figure 2:
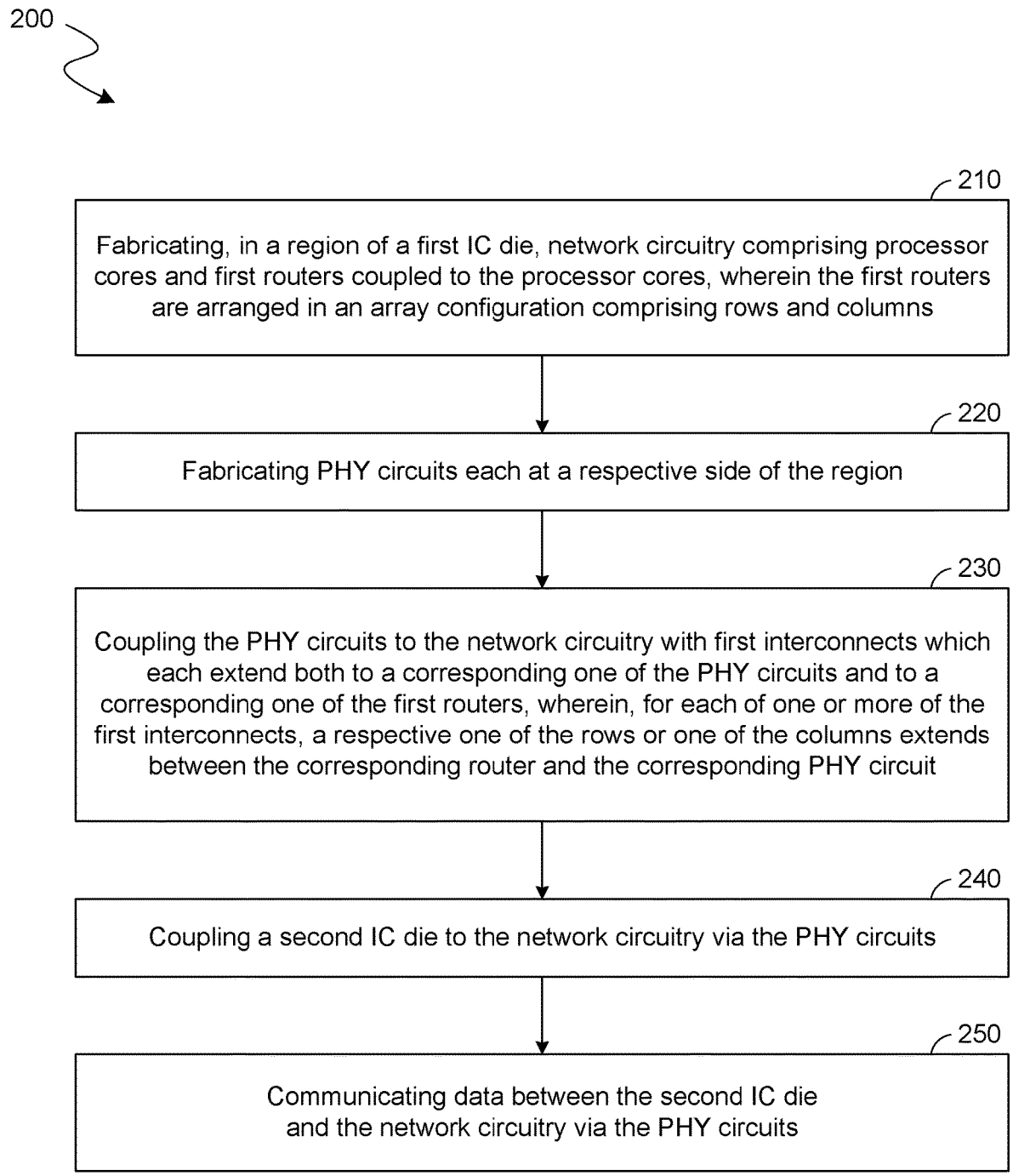
FIG. 2 illustrates a flow diagram showing a method to provide functionality of a network-on-chip according to an embodiment.

FIG. 2 shows features of a method 200 to provide functionality for communication between a physical layer circuit and network circuitry of an integrated circuit die according to an embodiment. Method 200 illustrates an embodiment which forms and/or operates circuit structures such as those of system 100 of device 150, for example.

As shown in FIG. 2, method 200 comprises (at 210) fabricating, in a region of a first IC die, network circuitry which comprises processor cores and first routers which are coupled to the processor cores, wherein the first routers are arranged in an array configuration comprising rows and columns. For example, the network circuitry comprises network nodes, some or all of which each include a respective one of a core, a router, a switch, or a bridge. In one example embodiment, the array configuration comprises the rows 172w, ..., 172z and columns 174a, ..., 174n of device 150.

In some embodiments, fabricating the network circuitry at 210 comprises fabricating network clusters in the region of the first IC die, where said clusters each comprise a different respective one of the rows. In one such embodiment, some or all routers of a given cluster are coupled with one another in an in-series configuration of the respective row. For each of the columns, the column comprises routers which are each of a different respective one of the clusters.

Method 200 further comprises (at 220) fabricating physical layer (PHY) circuits each at a respective side of the region. In an embodiment, the PHY circuits comprise one or more PHY circuits that are each to support communication with a respective memory sub-system. Additionally or alternatively, the PHY circuits comprise one or more PHY circuits that variously support high-speed communication—e.g., communications at up to or more than 10 gigatransfers per second (GT/s)—with a peripheral component interconnect express (PCIe) bus, an Ultra Path Interconnect (UPI) and/or other such interconnect circuitry.

In an embodiment, the fabricating at 210 and/or at 220 comprises any of various suitable additive processes and subtractive processes (e.g., including mask patterning, vapor deposition, etch, and/or other processes), one or more of which are adapted, for example, from conventional semiconductor fabrication techniques. Such conventional techniques are not limiting on some embodiments, and are not detailed herein to avoid obscuring features of said embodiments.

Method 200 further comprises (at 230) coupling the PHY circuits to the network circuitry with first interconnects which each extend both to a corresponding one of the PHY circuits and to a corresponding one of the first routers. For each of one or more of the first interconnects, a respective one of the rows or one of the columns extends between the corresponding router and the corresponding PHY circuit. For example, such one or more of the first interconnects each extends across a respective one or more of the rows (and/or across a respective one or more of the columns) to link the corresponding PHY and the corresponding router to each other.

In one embodiment, the coupling at 230 comprises forming a back-end-of-line (BEOL) of the first IC die, wherein the BEOL comprises various vias, traces and/or other conductive portions of the first interconnects—e.g., wherein active circuit components of the network circuitry are fabricated at 210 in a front-end-of-line (FEOL) of the first IC die. In some embodiments, such a BEOL comprises interconnect structures of the array configuration—e.g., wherein the BEOL includes one or more interconnects which are each coupled between a respective two network clusters of the network circuitry. Alternatively or in addition, the coupling at 230 comprises coupling the first IC die to a substrate (e.g., that of a silicon interposer) which has formed therein at least a portion of the first interconnects. In some embodiments, such a substrate additionally or alternatively comprises interconnect structures of the array configuration—e.g., including one or more interconnect structures which are each to be coupled between a respective two network clusters of the network circuitry.

In one example embodiment, fabricating the PHY circuits at 220 comprises fabricating first PHY circuits (e.g., PHYs 160a, ..., 160n) arranged along a first side of the region, and fabricating second PHY circuits (e.g., PHYs 160w, ..., 160z) arranged along a second side of the region.

For example, a first row of the array configuration is a closest of the rows to the first PHY circuits, where a first column of the array configuration is a closest of the columns to the second PHY circuits. The first interconnects comprise both second interconnects (e.g., links 162a, . . . , 162n) which each extend to a respective one of the first PHY circuits, and third interconnects (e.g., links 162w, . . . , 162z) which each extend to a respective one of the second PHY circuits. In one such embodiment, the one or more of the first interconnects comprise one of the second interconnects and one of the third interconnects. For example, two or more of the second interconnects (e.g., each of the second interconnects) variously extend each to be coupled at a different respective one of the rows, in some embodiments. Alternatively or in addition, two or more of the third interconnects (e.g., each of the third interconnects) variously extend each to be coupled at a different respective one of the columns. For example, in some embodiments, the network circuitry comprises network clusters which each comprise a different respective row of the array configuration (e.g., wherein, for each of the columns of the array configuration, the column comprises routers which are each of a different respective one of the clusters). In one such embodiment, for each of the clusters, the cluster comprises a respective second router to which one of the second interconnects extends, and a respective third router to which one of the third interconnects extends.

Although some embodiments are not limited in this regard, method 200 additionally or alternatively comprises one or more operations to couple the network circuitry, and the PHYs coupled thereto, with one or more other circuit resources which are distinct from the first IC die. For example, method 200 further comprises (at 240) coupling a second IC die to the network circuitry via one or more of the PHY circuits. In one such embodiment, coupling the second IC die at 240 comprises coupling one or more memories of the second IC die—e.g., including a DRAM memory, a cache memory, or the like—each to a respective one of the PHY circuits. Additionally or alternatively, method 200 comprises coupling a high speed interconnect—e.g., a PCIe bus, a UPI or the like—to the network circuitry via one of the PHY circuits. In some embodiments, the first die is coupled to a cache memory of the second IC die (or of some other IC die) independent of the PHY circuits which are fabricated at 220—e.g., wherein one or more level four (L4) caches of said other IC die are each linked to a respective one of the first routers. In the example embodiment shown, method 200 additionally or alternatively comprises (at 250) communicating data between the second IC die and the network circuitry via the one or more of the PHY circuits. For example, such communicating at 250 is to facilitate access to a memory by one or more cores of the network circuitry. Alternatively or in addition, such communicating is to output a result of data processing by the network circuitry.

Figure 3:
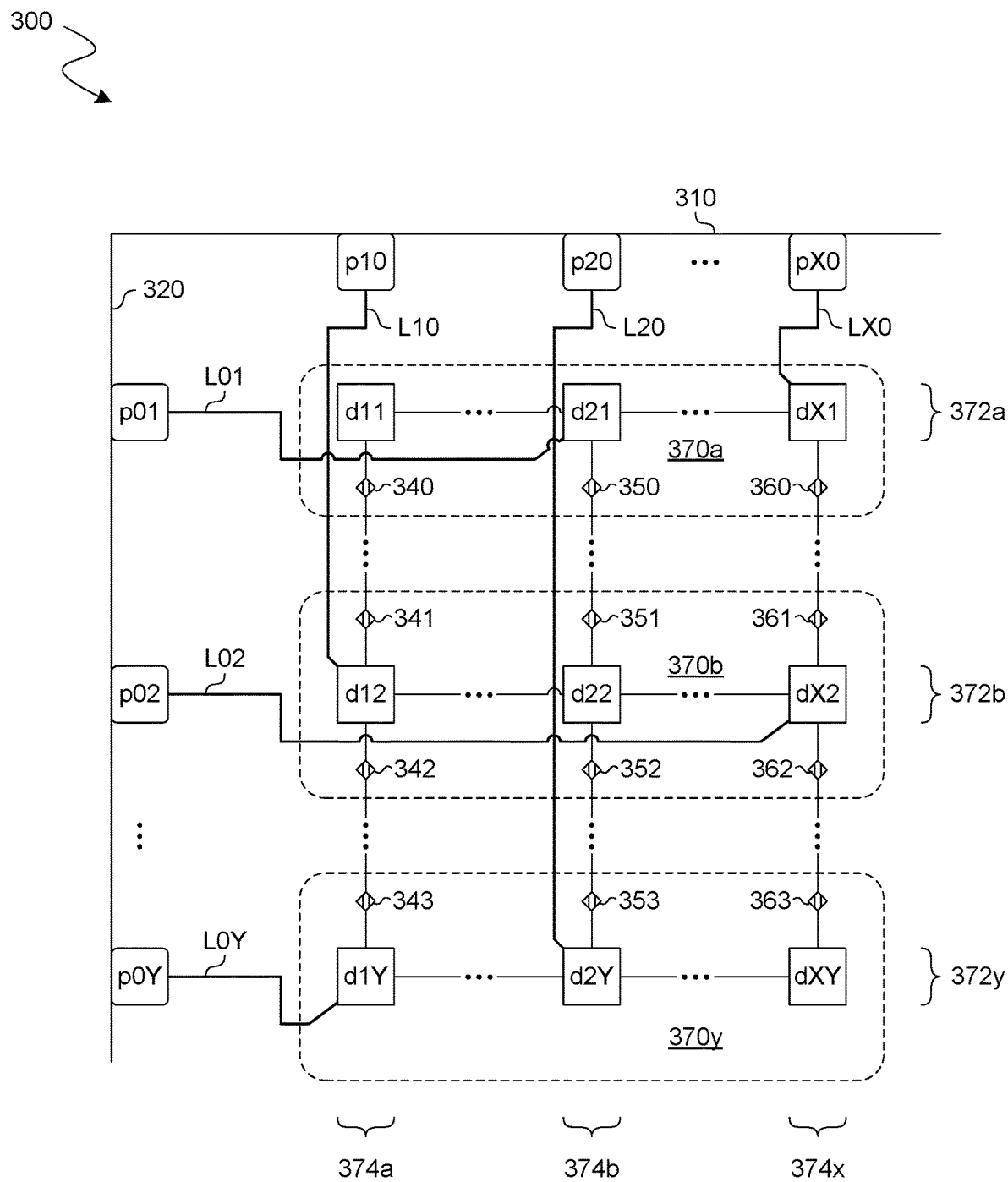
FIGS. 3 and 4 illustrate layout diagrams each showing a respective integrated circuit die according to a corresponding embodiment.

FIG. 3 shows features of device 300 to provide connectivity with a network-on-chip according to an embodiment. Device 300 is one example of an embodiment wherein network circuitry of an IC die comprises network clusters which are variously coupled to PHY circuits of the IC die. In an embodiment, device 300 includes features of system 100 or device 150—e.g., wherein device 300 comprises die 102 (and, in some embodiments, further comprises a substrate such as that illustrated by interposer 104) and/or wherein functionality of device 300 is provided with operations of method 200.

As illustrated by FIG. 3, network circuitry of device 300 comprises routers that are coupled to one another in an array configuration which, in the example embodiment shown, includes rows 372a, 372b, . . . , 372y and columns 374a, 374b, . . . , 374x. Such network circuitry is formed in a region of an IC die (such as region 103, for example), wherein PHYs p10, p20, . . . , pX0 of device 300 are arranged along a first side 310 of the region, and other PHYs p01, p02, . . . , p0Y of device 300 are arranged along a second side 320 of the region. For example, rows 372a, 372b, . . . , 372y correspond functionally to rows 172w, . . . , 172z, and columns 374a, 374b, . . . , 374x correspond functionally to columns 174a, . . . , 174n—e.g., wherein PHYs p10, p20, . . . , pX0 correspond functionally to PHYs 160a, . . . , 160n, and where PHYs p01, p02, . . . , p0Y correspond functionally to PHYs 160w, . . . , 160z.

The first routers of device 300 comprise (for example) routers d11, d21, . . . , dX1 of row 372a, routers d12, d22, . . . , dX2 of row 372b, and routers d1Y, d2Y, . . . , dXY of row 372y. In one such embodiment, the network circuitry of device 300 comprises network clusters—such as the illustrative clusters 370a, 370b, . . . , 370y shown—which, in turn, each comprise respective ones of the first routers, as well as respective cores (not shown) coupled to said routers. For a given one of the columns of the array configuration, the column comprises respective routers which are each of a different respective cluster. For example, column 374a comprises routers d11, d12, . . . , d1Y of the respective clusters 370a, 370b, . . . , 370y—e.g., where column 374b comprises routers d21, d22, . . . , d2Y of the respective clusters 370a, 370b, . . . , 370y, and where column 374x comprises routers dX1, dX2, . . . , dXY of the respective clusters 370a, 370b, . . . , 370y. The routers of a given row facilitate communication between nodes of the cluster which includes said row.

In an embodiment, communication between a given two clusters of device 300 is performed via one or more bridges which are each of a different respective one of said clusters. For example, for a given one of clusters 370a, 370b, . . . , 370y, the cluster comprises one or more bridges which are each coupled column-wise to be a respective point of access to said cluster by a respective other one of clusters 370a, 370b, . . . , 370y. By way of illustration and not limitation, the array configuration further comprises bridges 340, 350, 360 of cluster 370a, bridges 341, 351, 361, 342, 352, 362 of cluster 370b, and bridges 343, 353, 363 of cluster 370y. In one such embodiment, bridges 340, 350, 360 are coupled in different respective columns to bridges 341, 351, 361, respectively—e.g., where bridges 342, 352, 362 are coupled in different respective columns to bridges 343, 353, 363, respectively.

To facilitate efficient communication to and/or from the network circuitry of device 300, the first routers of the array configuration comprise second routers, each in a different respective one of columns 374a, 374b, . . . , 374x, which are variously coupled to serve as corresponding point-of-access routers each for a different respective one of PHYs p10, p20, . . . , pX0. In one such embodiment, at least one of the second routers is in a row other than any edge row of the array configuration—e.g., wherein, for each of one or more of the second routers, a respective one or more rows of the array configuration extend between said router and the corresponding PHY which is linked thereto.

Alternatively or in addition, the first routers comprise third routers, each in a different respective one of rows 372a, 372b, . . . , 372y, which are variously coupled to serve as corresponding point-of-access routers each for a different respective one of PHYs p01, p02, . . . , p0Y. In one such embodiment, at least one of the third routers is in a column other than any edge column of the array configuration—e.g., wherein, for each of one or more of the third routers, a respective one or more columns of the array configuration extend between said router and the corresponding PHY which is linked thereto.

By way of illustration and not limitation, device 300 further comprises a link L10 which extends to couple both to p10 and to d12—e.g., wherein a link L20 extends to couple both to p20 and to d2Y, and wherein a link LX0 extends to couple both to pX0 and to dX1. Alternatively or in addition, device 300 comprises a link L01 which extends to couple both to p01 and to d21—e.g., wherein a link L02 extends to couple both to p02 and to dX2, and where a link L0Y extends to couple both to p0Y and to d1Y. In providing point-of-access routers which are located in different respective rows and/or different respective columns of an array configuration, some embodiments variously facilitate efficient communication between one or more PHY circuits and network-on-chip circuitry.

Figure 4:
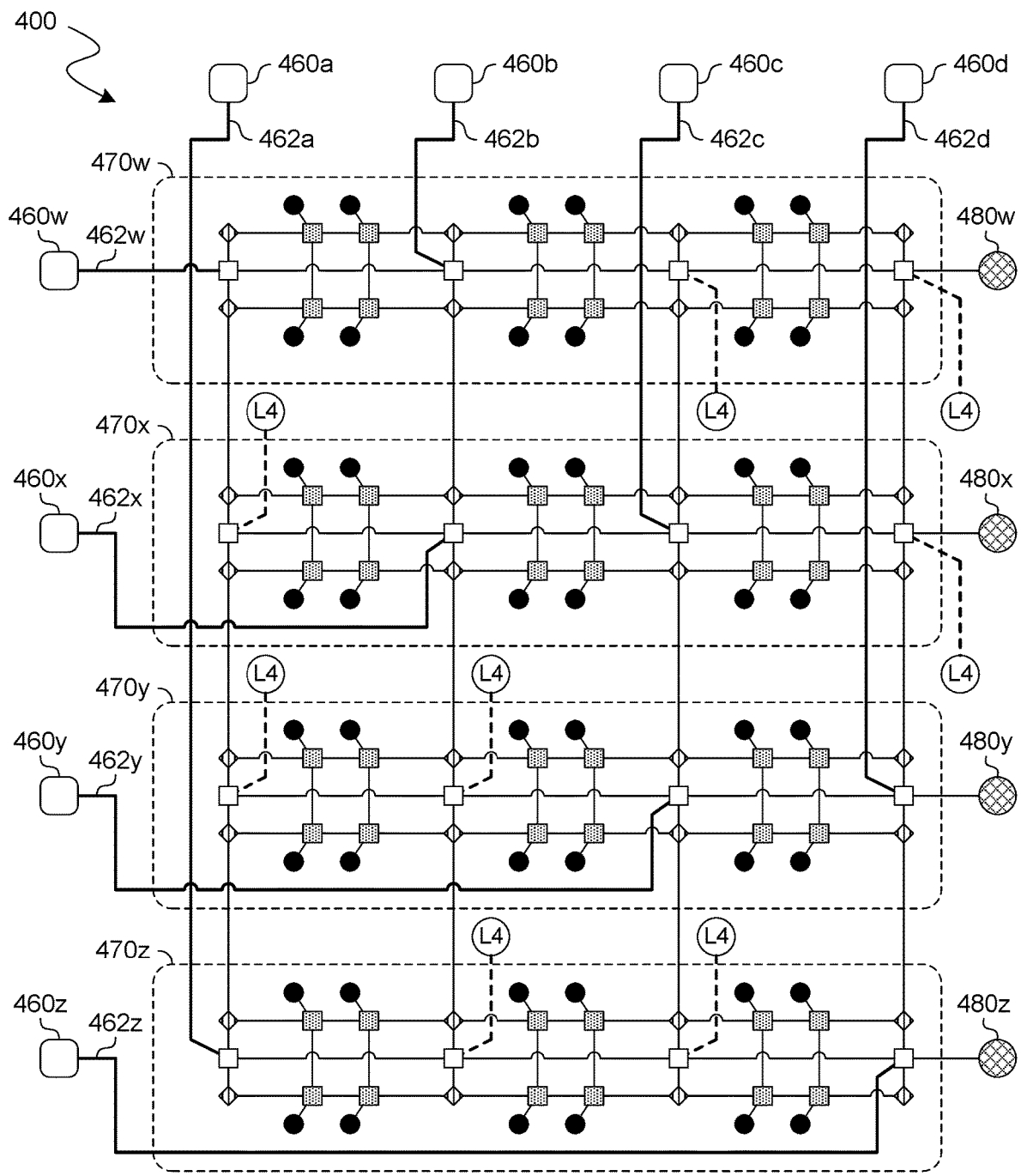

FIG. 4 shows features of circuitry 400 comprising a network-on-chip and PHY circuits of an IC die according to another embodiment. Circuitry 400 illustrates one example of an embodiment including features of system 100, device 150, or device 300—e.g., wherein functionality of circuitry 400 is provided with operations of method 200.

In the example embodiment shown, network-on-chip circuitry of device 400 comprises nodes—e.g., including processor cores, switches, bridges, and routers (see legend 405)—which are variously coupled in respective network clusters 470w-470z. Such clusters 470w-470z are variously formed in a region of an IC die (such as region 103, for example)—e.g., wherein PHYs 460a-460d of circuitry 400 are arranged along a first side of the region, and other PHYs 460w-460z of circuitry 400 are arranged along a second side of the region. For example, PHYs 460a-460d correspond functionally to PHYs 160a, . . . , 160n, in one embodiment—e.g., where PHYs 460w-460z correspond functionally to PHYs 160w, . . . , 160z.

In an embodiment, clusters 470w-470z comprise first routers which are arranged in an array configuration that includes rows and columns, wherein clusters 470w-470z each include a different respective one of said rows. For a given column of the array configuration, the column comprises routers which are each of a different respective one of clusters 470w-470z. In some embodiments, two or more of network clusters 470w-470z each include the same internal network topology. By way of illustration and not limitation, clusters 470w-470z each comprise a respective four (4) routers, and twelve (12) processor cores which are variously coupled to said routers each via a different respective switch. In one such embodiment, each of clusters 470w-470z further comprises a respective eight (8) bridges which are coupled to facilitate communication with another cluster, with a PHY of circuitry 400, and/or between other nodes of the cluster.

In some embodiments, each of the first routers has at least one additional port (other than any for linking to another network node of clusters 470w-470z), which is available to be linked to a circuit resource which is external to clusters 470w-470z. For example, such a circuit resource includes one of a PHY for providing access to a memory, a PHY of a high-speed IO port, or—in some embodiments—a cache (e.g., a L4 cache) formed on a substrate other than that of the IC die which includes clusters 470w-470z. In providing such additional ports, some embodiments variously facilitate any of various different configurations of circuitry 400 to enable efficient communication to and/or from a network-on-chip. For example, said embodiments provide for point-of-access routers which are located in different respective rows and/or different respective columns of an array configuration (e.g., including one or more point-of-access routers other than any at an edge row, or at an edge column, of the array configuration).

By way of illustration and not limitation, circuitry 400 further comprises a link 462a which extends column-wise to couple both to PHY 460a and to the row in cluster 470z—e.g., wherein a link 462b extends column-wise to couple both to PHY 460b and to the row in cluster 470w, wherein a link 462c extends column-wise to couple both to PHY 460c and to the row in cluster 470x, and wherein a link 462d extends column-wise to couple both to PHY 460d and to the row in cluster 470y. Alternatively or in addition, circuitry 400 comprises links 462w-462z which variously extends row-wise to couple PHYs 460w-460z (respectively) each to a different respective one of clusters 470w-470z. In one such embodiment, links 462w-462z each extend to a different respective column of the array configuration.

Although some embodiments are not limited in this regard, one or more other of the first routers are variously coupled each to a respective circuit resource that, for example, is stacked with or otherwise coupled to the IC die which includes clusters 470w-470z. For example, one or more of clusters 470w-470z each includes a respective router that is vertically coupled to a corresponding cache memory (indicated by "L4") of another IC die.

Alternatively or in addition, one or more other of the first routers are coupled to other interface hardware for coupling to other network circuitry (not shown) of circuitry 400. In the example embodiment shown, circuit device 400 further comprises interfaces 480w-480z which facilitate coupling of clusters 470w-470z (respectively) each to a respective other cluster (not shown) of circuit device 400. In such an embodiment, a given row of the array configuration may span multiple network clusters. For example, in some embodiments, the clusters 470w-470z shown are one quadrant (or other portion) of a larger network-on-chip which further comprises other similarly-configured network clusters.

Figure 5A:
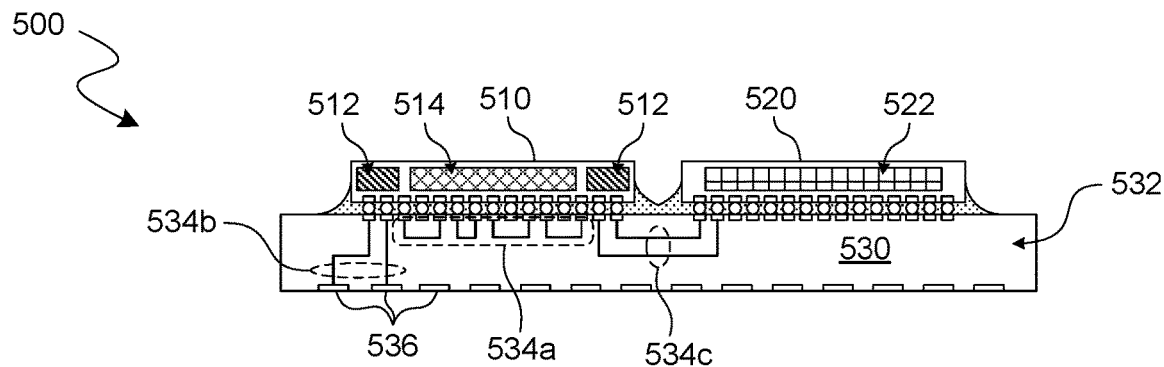
FIG. 5A illustrates a cross-sectional side view of a device comprising a network-on-chip according to an embodiment.

FIG. 5A shows features of a device 500 to facilitate communication with a network-on-chip according to an embodiment. In some embodiments, device 500 includes features of system 100, of one of devices device 150, 300, or of circuitry 400—e.g., wherein functionality of device 500 is provided according to method 200

As shown in FIG. 5A, device 500 comprises an IC die 510 and a substrate (such as that of the illustrative interposer 530 shown) coupled thereto—e.g., wherein IC die 510 and interposer 530 correspond functionally to die 102, and interposer 104, respectively. IC die 510 comprises network circuitry 514 and PHY circuitry 512 which is variously disposed along (e.g., around) a periphery of a region which includes network circuitry 514. For example, in some embodiments, network circuitry 514 corresponds functionally to network circuitry 130, and PHY circuitry 512 corresponds functionally to PHYs 112 and/or to PHYs 122.

Network circuitry 514 comprises at least some first routers, and processor cores which are variously coupled thereto—e.g., wherein the first routers are coupled to one another in an array configuration including rows and columns. PHY circuitry 512 is coupled to network circuitry 514 via first interconnects which variously extend each to couple both to a corresponding PHY circuit of PHY circuitry 512, and to a corresponding one of the first circuits. In some embodiments, for at least one of the first interconnects, a respective one or more rows (and/or a respective one or more columns) of the array configuration extend between the corresponding PHY circuit and the corresponding router.

Interposer 530 comprises an insulator material 532 and interconnect structures variously extending therein, the interconnect structures to variously provide electrical coupling each with one or more circuits which are each coupled at a respective side of said insulator material 532. By way of illustration and not limitation, interposer 530 comprises interconnect structures 534a which facilitate coupling between different circuits of IC die 510. For example, in some embodiments, network circuitry 514 comprises network nodes which are variously coupled to provide network clusters which each include a different respective row of the array configuration. For a given network cluster of network circuitry 514, the cluster comprises routers which are each of a different respective column of the array configuration. Although some embodiments are not limited in this regard, coupling between a given two nodes of one network cluster is provided (for example) entirely within IC die 510—e.g., with BEOL interconnect structures of IC die 510.

In some embodiments, interconnect structures 534a include one or more conductive structures (e.g., each comprising a via, a trace, and/or the like) which are each coupled between a respective two network nodes of network circuitry 514. For example, some or all such conductive structures are each coupled (e.g., column-wise) between a respective two clusters of network circuitry 514. In some embodiments, interconnect structures 534a additionally or alternatively comprise respective portions of one or more interconnects which are each coupled between a respective two network nodes which are of the same cluster of network circuitry 514.

Additionally or alternatively, interposer 530 comprises interconnect structures 534b which facilitate coupling between one or more PHYs of PHY circuitry 512, and one or more other circuit resources (not shown) which are to couple to interposer 530 via conductive contacts 536 (e.g., pads) thereof. In one such embodiment, interposer 530 includes or couples to a PCIe bus (or other such high-speed IO interconnect) which facilitates IO communication to/from a packaged device which comprises device 500.

Additionally or alternatively, interposer 530 comprises interconnect structures 534c which facilitate coupling between IC die 510 and active circuit components of some other IC die—such as the illustrative IC die 520 shown—which is included in (or alternatively, is to couple to) device 500. In the example embodiment shown, interconnect structures 534c provides connectivity between PHY circuitry 512 and memory circuitry 522 of IC die 520. By way of illustration and not limitation, memory circuitry 522 comprises one or more DRAM (or other) memory arrays and, in some embodiments, one or more memory controllers to provide network circuitry 514 with access to said one or more memory arrays. Such one or more memory arrays additionally or alternatively comprise one or more cache memories (e.g., including a L4 cache), in some embodiments.

The illustrated arrangement of interposer 530 and IC dies 510, 520 relative to one another is merely one example of any of various suitable configurations wherein electrical coupling between at least some circuit components of IC die 510 is provided with at least one substrate that is arranged vertically under (or alternatively, over) IC die 510. In one alternative arrangement, one of IC dies 510, 520 is vertically stacked over the other of IC dies 510, 520—e.g., where some coupling between IC dies 510, 520 is via a path which is independent of interposer 530.

Figure 5B:
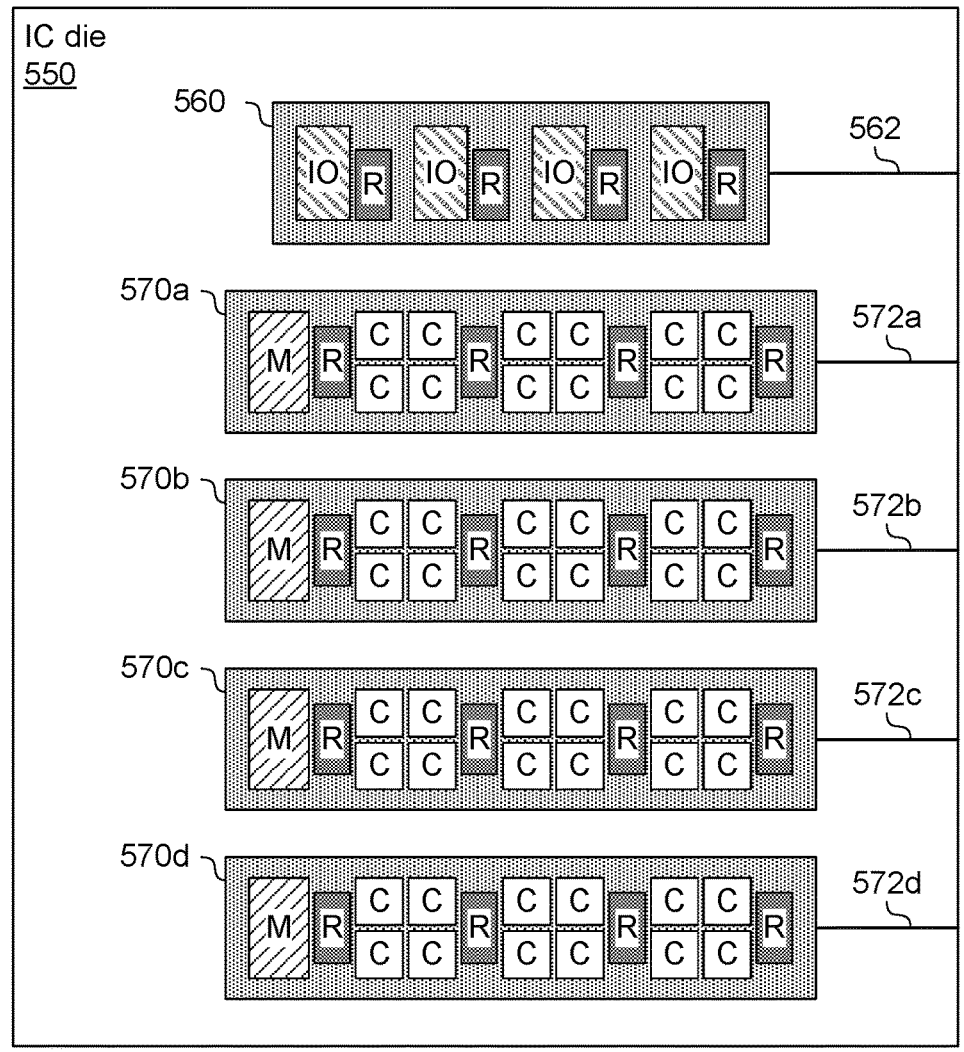
FIG. 5B illustrates a functional block diagram showing an integrated circuit die comprising network circuitry according to an embodiment.

FIG. 5B shows features of an IC die 550 to interconnect physical layer circuits with a network-on-chip according to an embodiment. In an embodiment, IC die 550 includes features of die 102 or IC die 510—e.g., wherein functionality of IC die 550 is provided according to method 200. As shown in FIG. 5B, IC die 550 includes network circuitry—such as network circuitry 130 or network circuitry 180, for example—which comprises at least some first routers, and processor cores variously coupled thereto. The first routers are coupled to one another (or otherwise accommodate coupling to one another) in an array configuration which includes rows and columns. For example, such network circuitry comprises network nodes which are variously distributed across multiple chiplets of IC die 550.

In the example embodiment shown, IC die 550 comprises chiplets 570a-570d which variously include nodes of different respective network clusters—e.g., where such network nodes comprise processor cores (indicated by the label "C") and routers (indicated by the label "R"). Two or more of (e.g., each of) chiplets 570a-570d have the same internal network topology, in various embodiments. For example, chiplets 570a-570d provide some or all circuitry of clusters 470w-470z (respectively). In some embodiments, for a given network cluster which is to be provided with IC die 550 (for example, for each such cluster), the cluster resides entirely on IC die 550—e.g., wherein a BEOL of IC die 550 comprises interconnects which each extend to a respective two nodes of a given cluster. In one such embodiment, a network of the multiple clusters resides entirely on IC die 550—e.g., wherein a given two of the clusters are coupled together via a respective one or more interconnects which also reside on IC die 550. In other embodiments, IC die 550 is to be coupled to a substrate (e.g., that of an interposer or another IC die) which provides at least some interconnect structures to facilitate, at least in part, coupling between different clusters and/or coupling between nodes of the same cluster.

In the example embodiment shown, IC die 550 further comprises another chiplet 560 which includes first PHY circuits (labeled "IO") which are each to facilitate communication between IC die 550 and a respective high-speed IO interconnect that is to be coupled to IC die 550. Chiplets 570a-570d each further comprise a respective one of second PHY circuits (labeled "M") which are each to facilitate communication between IC die 550 and a respective memory resource that is to be coupled to IC die 550. In one such embodiment, the first (IO) PHYs of chiplet 560 correspond functionally to PHYs 160a, . . . , 160n—e.g., where the second (M) PHYs of chiplets 570a, . . . , 570d correspond functionally to PHYs 160w, . . . , 160z.

In some embodiments, IC die 550 accommodates coupling to an underlying substrate (not shown) that provides, at least in part, coupling between various ones of chiplets 570a-570d. For example, such a substrate (e.g., that of interposer 104 or interposer 530) comprises at least some portion of interconnect structures such as those of columns 174a, . . . , 174n (or those of columns 374a, 374b, . . . , 374x).

In such embodiments, the first (IO) PHYs and second (M) PHYs of IC die 550 are variously provided with coupling to respective point-of-access routers which are distributed across multiple rows and/or across multiple columns of the array configuration. Coupling between such PHYs and the interconnected clusters is provided, for example, with interconnect structures of IC die 550 and/or with interconnect structures of a substrate that is to be coupled to IC die 550.

In one such embodiment, one or more of the point-of-access routers are each located in a respective row other than any edge row of the array configuration and/or in a respective column other than any edge column of the array configuration.

In various embodiments, chiplets 570a-570d include nodes of only one quadrant (or other portion) of a network-on-chip that is to be implemented with IC die 550. For example, IC die 550 further comprises one or more interconnects (such as the illustrative interconnects 572a-572d shown) that variously facilitate communication between chiplets 570a-570d and one or more other chiplets (not shown) of IC die 550. Additionally or alternatively, IC die 550 comprises an interconnect 562 which is to facilitate coupling to another chiplet (not shown) which provides functionality such as that of chiplet 560.

Figure 6:
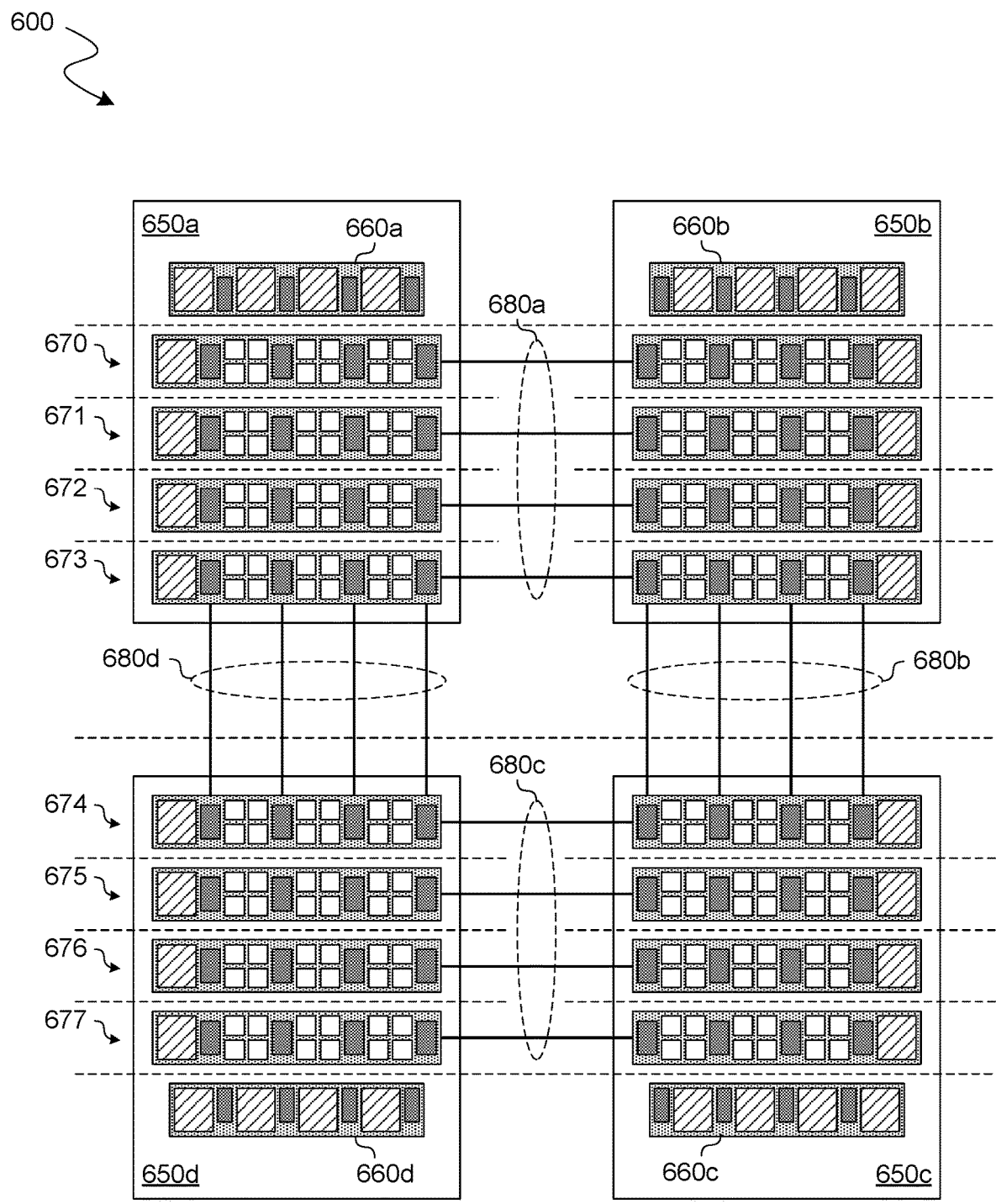
FIG. 6 illustrates a functional block diagram showing a device comprising a network-on-chip according to an embodiment.

By way of illustration and not limitation, FIG. 6 shows features of an IC die 600 which is configured to facilitate communication between physical layer circuits and network clusters according to an embodiment. IC die 600 is one example of an embodiment wherein chiplets of a die are coupled (or otherwise accommodate such coupling) to provide network circuitry which includes first routers that are arranged in an array configuration. Some or all of said chiplets each include network nodes of a different respective network cluster. In one such embodiment, IC die 600 includes features of IC die 550—e.g., wherein functionality of IC die 600 is provided according to method 200.

As shown in FIG. 6, circuitry of IC die 600 is arranged in quadrants 650a-650d which include different respective chiplets. For example, quadrants 650a-650d comprise respective chiplets 660a-660d which, in turn, comprise respective PHY circuits. In one such embodiment, chiplets 660a-660d variously provide functionality such as that of chiplet 560. For other chiplets of IC die 600, each such chiplet includes nodes of a corresponding network cluster—e.g., wherein the chiplet further comprises a PHY circuit at one end thereof. Accordingly, PHY circuits of IC die 600 are arranged around a region in which is disposed nodes that are included in (or are to be coupled in) a network of multiple clusters.

By way of illustration and not limitation, IC die 600 comprises interconnects 680a which variously couple clusters of quadrant 650a to respective clusters of quadrant 650b, as well as interconnects 680c which variously couple clusters of quadrant 650c to respective clusters of quadrant 650d. In various embodiments, rows 670-673 of the array configuration each include routers of a different respective cluster of quadrant 650a, as well as routers of a different respective cluster of quadrant 650b. Other rows 674-677 of the array configuration each include routers of a different respective cluster of quadrant 650c, as well as routers of a different respective cluster of quadrant 650d. IC die 600 further comprises interconnects 680b which are variously coupled between quadrants 650b, 650c, as well as interconnects 680d which are variously coupled between quadrants 650a, 650d. In one such embodiment, the array configuration comprises columns which each include (in addition to routers of different respective clusters) a respective one of interconnects 680d, or a respective one of interconnects 680b. In an alternative embodiment, IC die 600 omits one or more portions of interconnects 680a-680d—e.g., wherein IC die 600 accommodates coupling to a substrate (such as that of a silicon interposer or another IC die) which includes said one or more portions.

In such embodiments, PHYs of IC die 600 are variously provided with coupling to respective point-of-access routers which are distributed across multiple rows and/or across multiple columns of the array configuration. Coupling between such PHYs and the interconnected clusters is provided, for example, with interconnect structures (not shown) of IC die 600 and/or with interconnect structures of a substrate that is to be coupled to IC die 600. In one such embodiment, one or more of the point-of-access routers are each located in a respective row other than any edge row of the array configuration and/or in a respective column other than any edge column of the array configuration.

Figure 7:
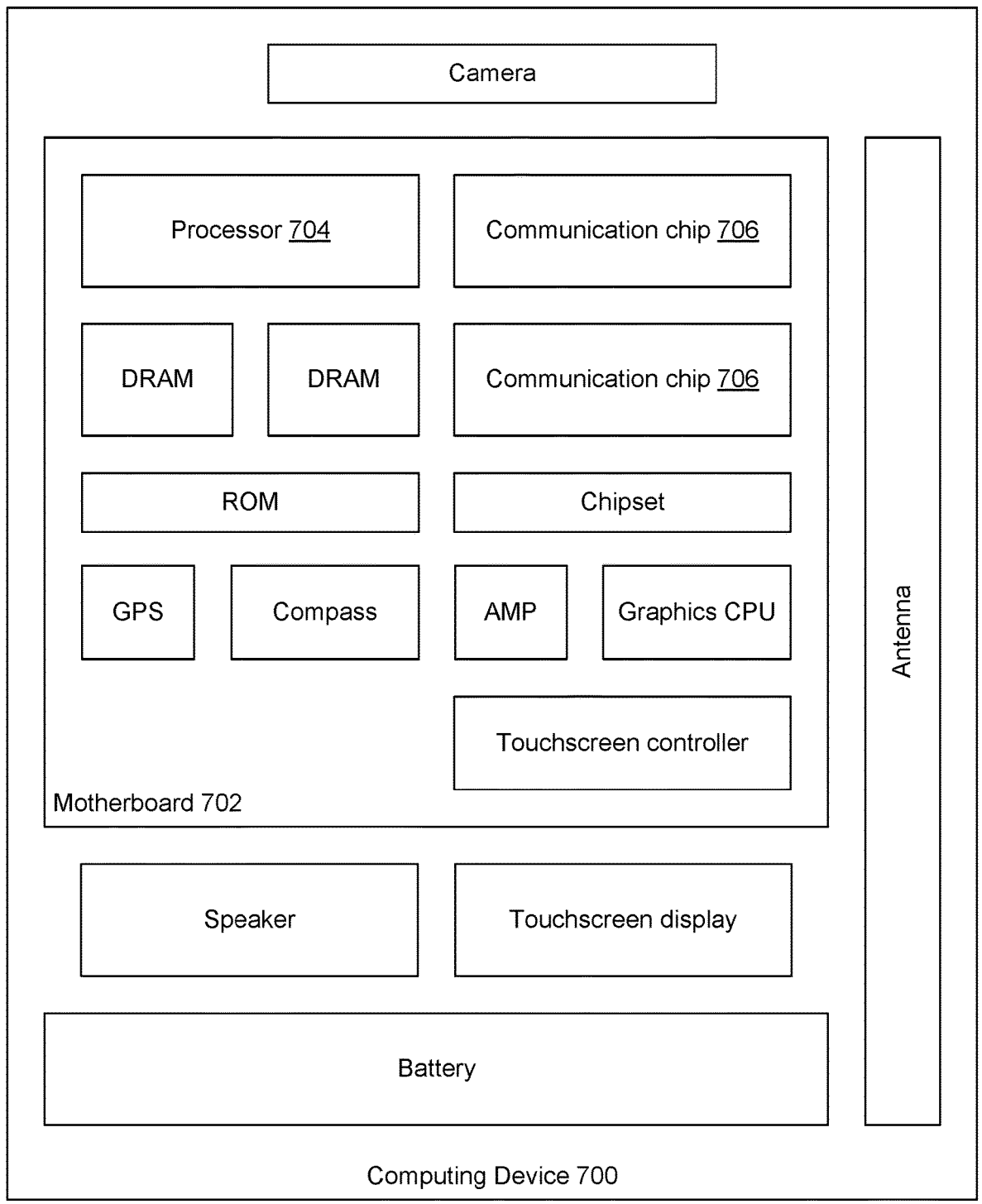
FIG. 7 illustrates a functional block diagram showing a computing device in accordance with one embodiment.

FIG. 7 illustrates a computing device 700 in accordance with one embodiment. The computing device 700 houses a board 702. The board 702 may include a number of components, including but not limited to a processor 704 and at least one communication chip 706. The processor 704 is physically and electrically coupled to the board 702. In some implementations, the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. The term "processor" may refer to any device or portion of a device that processes electronic data from registers and/or memory to transform that electronic data into other electronic data that may be stored in registers and/or memory. The communication chip 706 also includes an integrated circuit die packaged within the communication chip 706.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 8:
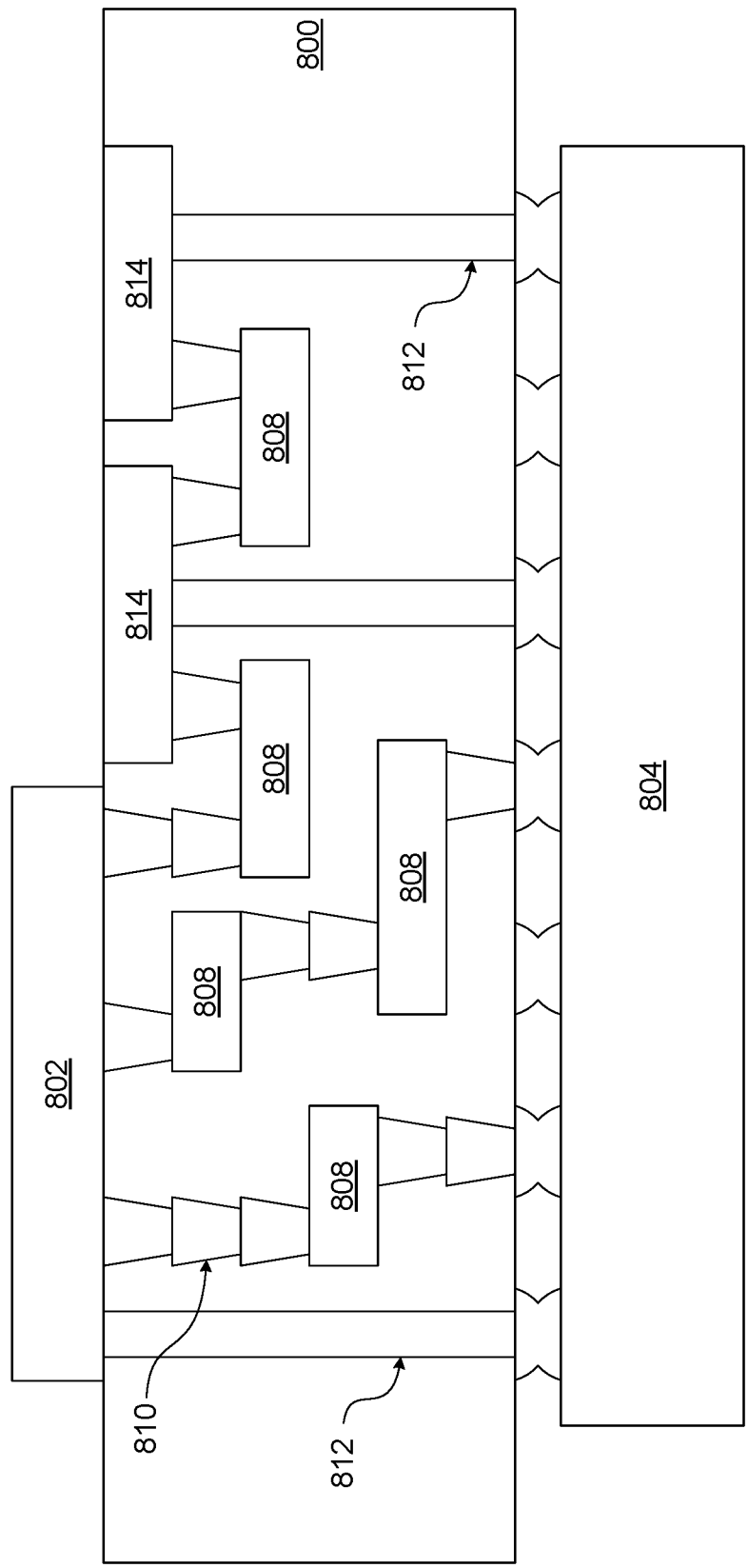
FIG. 8 illustrates a cross-sectional view of an interposer implementing one or more embodiments.

FIG. 8 illustrates an interposer 800 that includes one or more embodiments. The interposer 800 is an intervening substrate used to bridge a first substrate 802 to a second substrate 804. The first substrate 802 may be, for instance, an integrated circuit die. The second substrate 804 may be, for instance, a memory module, a computer motherboard, or another integrated circuit die. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802, 804 are attached to opposing sides of the interposer 800. In other embodiments, the first and second substrates 802, 804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800. In accordance with some embodiments, apparatuses or processes disclosed herein may be used in the fabrication of interposer 800.

Figure 9:
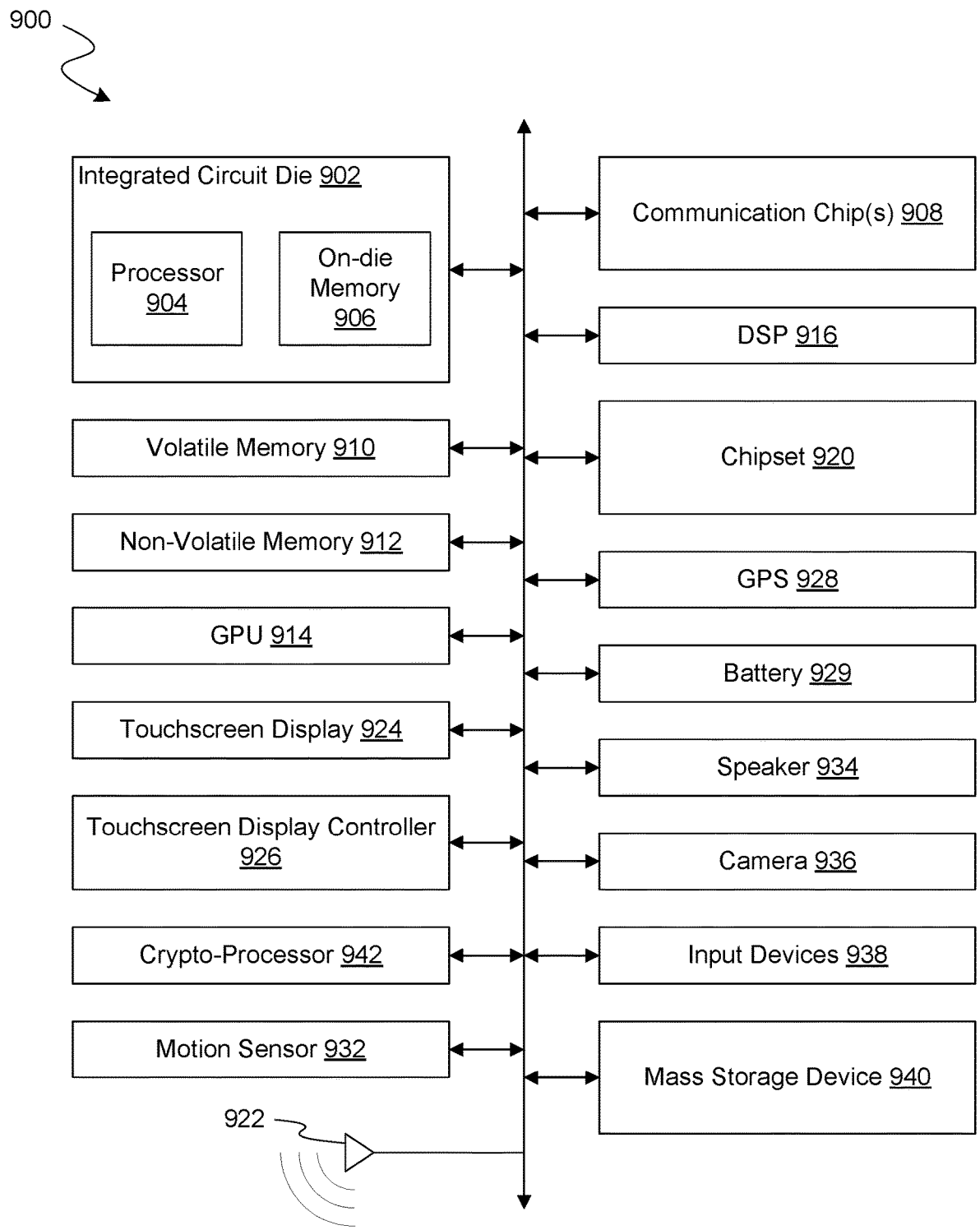
FIG. 9 illustrates a functional block diagram showing a computing device built in accordance with an embodiment.

FIG. 9 illustrates a computing device 900 in accordance with one embodiment. The computing device 900 may include a number of components. In one embodiment, these components are attached to one or more motherboards. In an alternate embodiment, these components are fabricated onto a single system-on-a-chip (SoC) die rather than a motherboard. The components in the computing device 900 include, but are not limited to, an integrated circuit die 902 and at least one communication chip 908. In some implementations the communication chip 908 is fabricated as part of the integrated circuit die 902. The integrated circuit die 902 may include a CPU 904 as well as on-die memory 906, often used as cache memory, that can be provided by technologies such as embedded DRAM (eDRAM) or spin-transfer torque memory (STTM or STTM-RAM).

Computing device 900 may include other components that may or may not be physically and electrically coupled to the motherboard or fabricated within an SoC die. These other components include, but are not limited to, volatile memory 910 (e.g., DRAM), non-volatile memory 912 (e.g., ROM or flash memory), a graphics processing unit 914 (GPU), a digital signal processor 916, a crypto processor 942 (a specialized processor that executes cryptographic algorithms within hardware), a chipset 920, an antenna 922, a display or a touchscreen display 924, a touchscreen controller 926, a battery 929 or other power source, a power amplifier (not shown), a global positioning system (GPS) device 928, a compass 930, a motion coprocessor or sensors 932 (that may include an accelerometer, a gyroscope, and a compass), a speaker 934, a camera 936, user input devices 938 (such as a keyboard, mouse, stylus, and touchpad), and a mass storage device 940 (such as hard disk drive, compact disk (CD), digital versatile disk (DVD), and so forth).

The communications chip 908 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 908 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 908. For instance, a first communication chip 908 may be dedicated to shorter range wireless communications such as Wi-Fi and Bluetooth and a second communication chip 908 may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory. In various embodiments, the computing device 900 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Techniques and architectures for providing connectivity with a network-on-chip are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A device comprising:
   an integrated circuit (IC) die comprising:
      network circuitry in a region of the IC die, the network circuitry comprising processor cores and routers coupled to the processor cores, wherein the routers are arranged in an array configuration comprising rows and columns; and
      physical layer (PHY) circuits each at a respective side of the region, the PHY circuits coupled to the network circuitry via interconnects which each extend both to a corresponding one of the PHY circuits and to a corresponding one of the routers, wherein, for each of one or more of the interconnects:
         the corresponding router is in a respective row of the array configuration other than any edge row of the array configuration; and
         the corresponding router is in a respective column of the array configuration other than any edge column of the array configuration;
   wherein the PHY circuits comprise first PHY circuits arranged along a first side of the region, and second PHY circuits arranged along a second side of the region;
   wherein a first row of the array configuration is a closest of the rows to the first PHY circuits, and a first column of the array configuration is a closest of the columns to the second PHY circuits;
      wherein the interconnects are first interconnects which comprise:
         second interconnects which each extend to a respective one of the first PHY circuits; and
         third interconnects which each extend to a respective one of the second PHY circuits; and
      wherein the one or more of the first interconnects comprise one of the second interconnects and one of the third interconnects.

2. The device of claim 1, wherein two or more of the second interconnects each extend to a different respective one of the rows; and
   wherein two or more of the third interconnects each extend to a different respective one of the columns.

3. The device of claim 1, wherein the network circuitry comprises network clusters which each comprise a different respective one of the rows, wherein, for each of the columns, the column comprises routers each of a different respective one of the clusters.

4. The device of claim 3, wherein the routers are first routers, and wherein, for each of the clusters, the cluster comprises:
   a respective second router to which one of the second interconnects extends; and
   a respective third router to which one of the third interconnects extends.

5. The device of claim 1, wherein the IC die is a first IC die, the device further comprising:
   a second IC die coupled to the first PHY circuits, the second IC die comprising one or more memories each coupled to a respective one of the PHY circuits.

6. The device of claim 1, wherein the IC die comprises the interconnects.

7. The device of claim 1, wherein the device comprises a substrate coupled to the IC die, the substrate including respective portions of one or more of the interconnects.

8. The device of claim 1, further comprising a substrate coupled to the IC die, the substrate including one or more cache memories each coupled to the network circuitry via a respective one of the routers.

9. The device of claim 1, wherein the network circuitry comprises network clusters which each comprise a different respective one of the rows, wherein, for each of the columns, the column comprises routers each of a different respective one of the clusters.

10. The device of claim 1, further comprising an input/output bus coupled to the IC die via one of the PHY circuits.

11. A system comprising:
an integrated circuit (IC) die comprising:
network circuitry in a region of the IC die, the network circuitry comprising processor cores and routers coupled to the processor cores, wherein the routers are arranged in an array configuration comprising rows and columns; and
physical layer (PHY) circuits each at a respective side of the region, the PHY circuits coupled to the network circuitry via interconnects which each extend both to a corresponding one of the PHY circuits and to a corresponding one of the routers, wherein, for each of one or more of the interconnects:
the corresponding router is in a respective row of the array configuration other than any edge row of the array configuration; and
the corresponding router is in a respective column of the array configuration other than any edge column of the array configuration;
wherein the PHY circuits comprise first PHY circuits arranged along a first side of the region, and second PHY circuits arranged along a second side of the region;
wherein a first row of the array configuration is a closest of the rows to the first PHY circuits, and a first column of the array configuration is a closest of the columns to the second PHY circuits;
wherein the interconnects are first interconnects which comprise:
second interconnects which each extend to a respective one of the first PHY circuits; and
third interconnects which each extend to a respective one of the second PHY circuits; and
wherein the one or more of the first interconnects comprise one of the second interconnects and one of the third interconnects; and a display device coupled to the IC die, the display device to display an image based on a signal communicated with the network circuitry via the PHY circuits.

12. The system of claim 11, wherein two or more of the second interconnects each extend to a different respective one of the rows; and
wherein two or more of the third interconnects each extend to a different respective one of the columns.

13. The system of claim 11, wherein the IC die comprises the interconnects.

14. The system of claim 11, further comprising a substrate coupled to the IC die, the substrate including one or more cache memories each coupled to the network circuitry via a respective one of the routers.

15. A device comprising:
an integrated circuit (IC) die comprising:
network circuitry in a region of the IC die, the network circuitry comprising routers which are coupled to one another in an array configuration comprising rows and columns; and
physical layer (PHY) circuits each at a respective side of the region, the PHY circuits coupled to the network circuitry via interconnects which each extend both to a corresponding one of the PHY circuits and to a corresponding one of the routers, wherein one or more of the interconnects each extend across a respective one or more of the rows or across a respective one or more of the columns;
wherein the interconnects are first interconnects which comprise:
second interconnects which each extend to a first side of the region; and
third interconnects which each extend to a second side of the region; and
wherein the one or more of the first interconnects comprise one of the second interconnects and one of the third interconnects.

16. The device of claim 15, wherein the network circuitry comprises network clusters which each comprise a different respective one of the rows, wherein, for each of the columns, the column comprises routers each of a different respective one of the clusters.

17. The device of claim 16, wherein the routers are first routers, and wherein, for each of the clusters, the cluster comprises:
a respective second router to which one of the second interconnects extends; and
a respective third router to which one of the third interconnects extends.

* * * * *